US010651855B2

(12) United States Patent
Kikuchi

(10) Patent No.: US 10,651,855 B2
(45) Date of Patent: May 12, 2020

(54) OSCILLATOR, ELECTRONIC APPARATUS, AND VEHICLE

(71) Applicant: SEIKO EPSON CORPORATION, Tokyo (JP)

(72) Inventor: Takayuki Kikuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 225 days.

(21) Appl. No.: 15/614,923

(22) Filed: Jun. 6, 2017

(65) Prior Publication Data

US 2017/0359075 A1  Dec. 14, 2017

(30) Foreign Application Priority Data

Jun. 10, 2016 (JP) .................................. 2016-116221

(51) Int. Cl.
| | | |
|---|---|---|
| *H03L 1/04* | (2006.01) | |
| *H03H 9/10* | (2006.01) | |
| *H03H 9/05* | (2006.01) | |
| *G05D 23/19* | (2006.01) | |
| *G01K 7/02* | (2006.01) | |
| *H03L 1/02* | (2006.01) | |
| *G01K 7/16* | (2006.01) | |

(52) U.S. Cl.
CPC ................ *H03L 1/04* (2013.01); *G01K 7/021* (2013.01); *G01K 7/023* (2013.01); *G05D 23/1917* (2013.01); *H03H 9/0547* (2013.01); *H03H 9/1021* (2013.01); *H03L 1/022* (2013.01); *G01K 2007/163* (2013.01); *H03L 1/027* (2013.01); *H03L 1/028* (2013.01)

(58) Field of Classification Search
CPC .... H03B 5/02; H03B 5/04; H03L 1/04; H03L 1/022; H03L 1/027; H03L 1/028; G01K 7/021; G01K 7/023; H03H 9/1021; H03H 9/0547; G05D 23/1917
USPC .................................... 331/158, 176, 116 FE
See application file for complete search history.

(56) References Cited

U.S. PATENT DOCUMENTS

| | | | |
|---|---|---|---|
| 10,171,090 B2* | 1/2019 | Okubo .................... H03L 1/028 |
| 2006/0192626 A1* | 8/2006 | Milliren ................... H03B 5/04 |
| | | | 331/158 |

(Continued)

FOREIGN PATENT DOCUMENTS

| | | |
|---|---|---|
| JP | 2015-056728 A | 3/2015 |
| JP | 2015-119212 A | 6/2015 |

(Continued)

*Primary Examiner* — Arnold M Kinkead
(74) *Attorney, Agent, or Firm* — Oliff PLC

(57) ABSTRACT

An oscillator includes a container, an oscillation element housed in the container, a heating circuit housed in the container, and adapted to control a temperature of the oscillation element, a temperature detection circuit housed in the container, a temperature control circuit housed in the container, and adapted to control the heating circuit based on an output of the temperature detection circuit, at least one connecting wire housed in the container, and electrically connects a ground of the temperature detection circuit and a ground of the temperature control circuit to each other, and a ground external terminal disposed on an outer surface of the container, and electrically connected to the ground of the temperature detection circuit and the ground of the temperature control circuit.

10 Claims, 11 Drawing Sheets

(56) References Cited

U.S. PATENT DOCUMENTS

2015/0116052 A1* 4/2015 Kikushima .......... H03H 9/0552
　　　　　　　　　　　　　　　　　　　　　331/158
2015/0180481 A1　6/2015 Isohata
2015/0282322 A1　10/2015 Kondo

FOREIGN PATENT DOCUMENTS

JP　　2015-122607 A　7/2015
JP　　2015-186128 A　10/2015

* cited by examiner

OSCILLATOR, ELECTRONIC APPARATUS, AND VEHICLE

CROSS-REFERENCE TO RELATED APPLICATIONS

This application claims priority to Japanese Patent Application No. 2016-116221, filed Jun. 10, 2016, the entirety of which is hereby incorporated by reference.

BACKGROUND

1. Technical Field

Various embodiments of the present invention relates to an oscillator, an electronic apparatus, and a vehicle.

2. Related Art

As described in JP-A-2015-122607, in the past, there has been known an oven-controlled crystal oscillator (OCXO) as an oscillator using a quartz crystal resonator element. The oscillator of JP-A-2015-122607 includes a circuit element (an oscillation IC), a heating body, a vibrator element, and a package for housing these elements, and is arranged to be able to exert high frequency stability while avoiding an influence of the ambient temperature by heating the heating body to keep the ambient temperature of the resonator element constant.

Further, in the oscillator of JP-A-2015-122607, it is possible to electrically connect both of the ground terminal of the circuit element (the heater IC) provided to the heating element and the ground terminal of the circuit element (the oscillation IC) to a ground mounting terminal, which is disposed on the package bottom surface, via internal interconnections of the package. However, since the electric resistance of the internal interconnections is high, and the current flowing through the heater IC is high, the ground potential of the heater IC varies in accordance with the operation state of the heating body. In contrast, since the current flowing through the oscillation IC is faint, the ground potential of the oscillation IC is roughly constant. Therefore, under such an extreme environment as low temperature with external winds, a difference occurs between the characteristic of temperature-temperature sensor output set to the oscillation IC and the actual output of the temperature sensor, and there is a possibility that the temperature control is not correctly performed.

SUMMARY

An advantage of some aspects of the invention is to provide an oscillator, an electronic apparatus, and a vehicle each capable of reducing the degradation of the accuracy of the temperature control.

The advantage can be achieved by the following application examples.

An oscillator according to this application example includes an oscillation element, a heating circuit adapted to control a temperature of the oscillation element, a temperature detection circuit, a temperature control circuit adapted to control an operation of the heating circuit based on an output of the temperature detection circuit, a container having a housing space, and adapted to house the oscillation element, the heating circuit, the temperature detection circuit, and the temperature control circuit in the housing space, a ground external terminal disposed on an outer surface of the container, and electrically connected to each of a ground of the temperature detection circuit and a ground of the temperature control circuit, and at least one connecting wire adapted to electrically connect the ground of the temperature detection circuit and the ground of the temperature control circuit to each other in the housing space.

According to this configuration, an oscillator capable of reducing the degradation of the accuracy of the temperature control can be obtained.

In the oscillator of the application example, it is preferable that the heating circuit and the temperature detection circuit are included in a same circuit element.

According to this configuration, the temperature of the heating circuit can accurately be controlled, the ambient temperature of the oscillation element can more accurately be kept constant, and higher frequency stability can be exerted.

In the oscillator according to the application example, it is preferable that the at least one connecting wire is a bonding wire.

According to this configuration, the configuration of the connecting wire becomes simple.

In the oscillator according to the application example, it is preferable that the number of the at least one connecting wire is plural.

According to this configuration, the ground of the temperature detection circuit and the ground of the temperature control circuit can electrically be connected with greater ease.

In the oscillator according to the application example, it is preferable that there is further included an interconnection adapted to electrically connect the plurality of connecting wires, and provided to the container so as to be exposed to the housing space.

According to this configuration, the ground of the temperature detection circuit and the ground of the temperature control circuit can electrically be connected with greater ease. Further, it is possible to provide gold plating on the surface of the interconnection, and thus, it is possible to decrease the electric resistance of the interconnection.

In the oscillator according to the application example, it is preferable that the container has an insulating property, and includes a base adapted to support the oscillation element, the heating circuit, the temperature detection circuit, and the temperature control circuit, and a lid bonded to the base so as to form the housing space with the base, and the ground external terminal is disposed on the base.

According to this configuration, the electrical connection between each of the ground of the temperature detection circuit and the ground of the temperature control circuit via the internal interconnection of the base becomes easy.

In the oscillator according to the application example, it is preferable that an interconnection embedded inside the container is excluded from an electric path electrically connecting the ground of the temperature detection circuit and the ground of the temperature control circuit to each other via the at least one connecting wire.

According to this configuration, the accuracy of the temperature control can further be improved.

In the oscillator according to the application example, it is preferable that the heating circuit and the temperature detection circuit are included in a first integrated circuit element, the temperature control circuit is included in a second integrated circuit element, a first ground pattern electrically connected to a ground terminal of the first integrated circuit element, and overlapping the first integrated circuit element in a planar view, and a second ground pattern electrically connected to a ground terminal of the second integrated circuit element, and overlapping the second integrated circuit element in a planar view are provided, and the first ground pattern and the second ground pattern are electrically connected to each other by the at least one connecting wire.

According to this configuration, the first ground pattern and the second ground pattern function as a shield layer, and it is possible to more stably drive the oscillation element.

An electronic apparatus according to this application example includes the oscillator according to any one of the application examples described above.

According to this application example, the electronic apparatus high in reliability can be obtained.

A vehicle according to this application example includes the oscillator according to any one of the application examples described above.

According to this application example, the vehicle high in reliability can be obtained.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, an oscillator, an electronic apparatus, and a vehicle according to the invention will be explained in detail based on some embodiments shown in the accompanying drawings.

Figure 1:
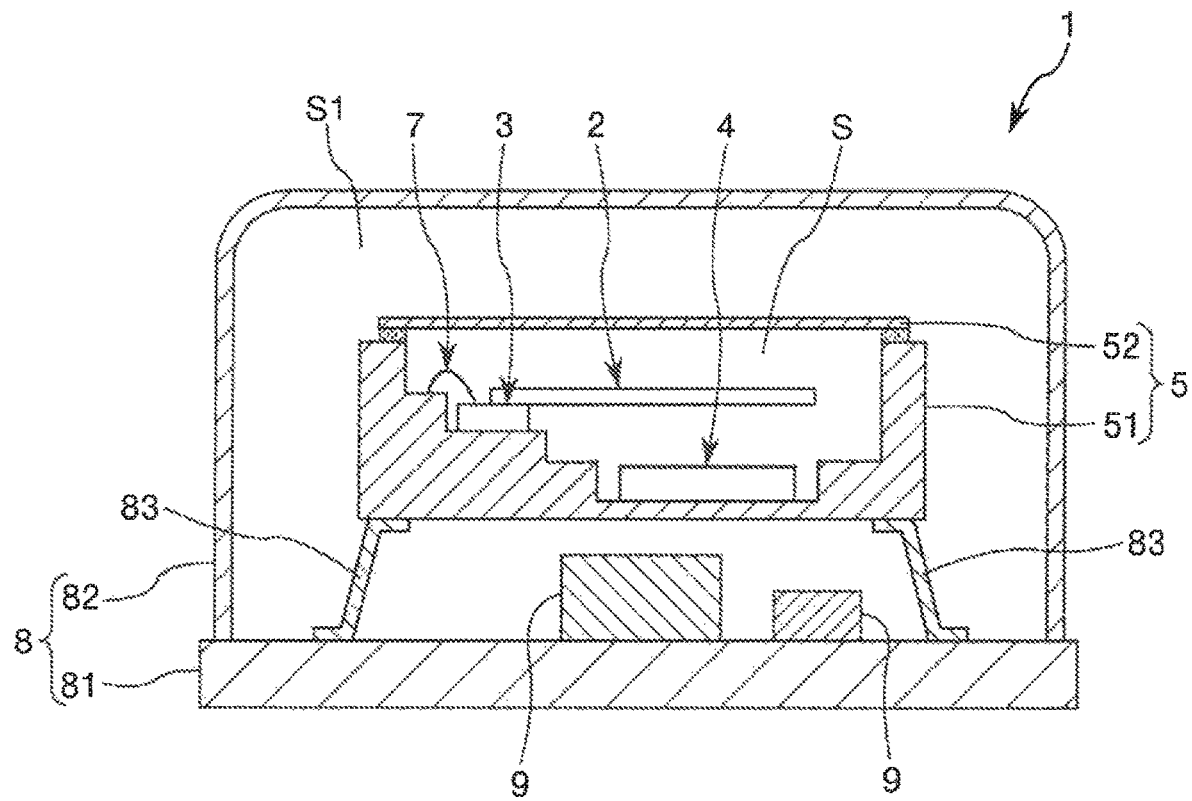
FIG. 1 is a cross-sectional view of an oscillator according to an embodiment.
Figure 2:
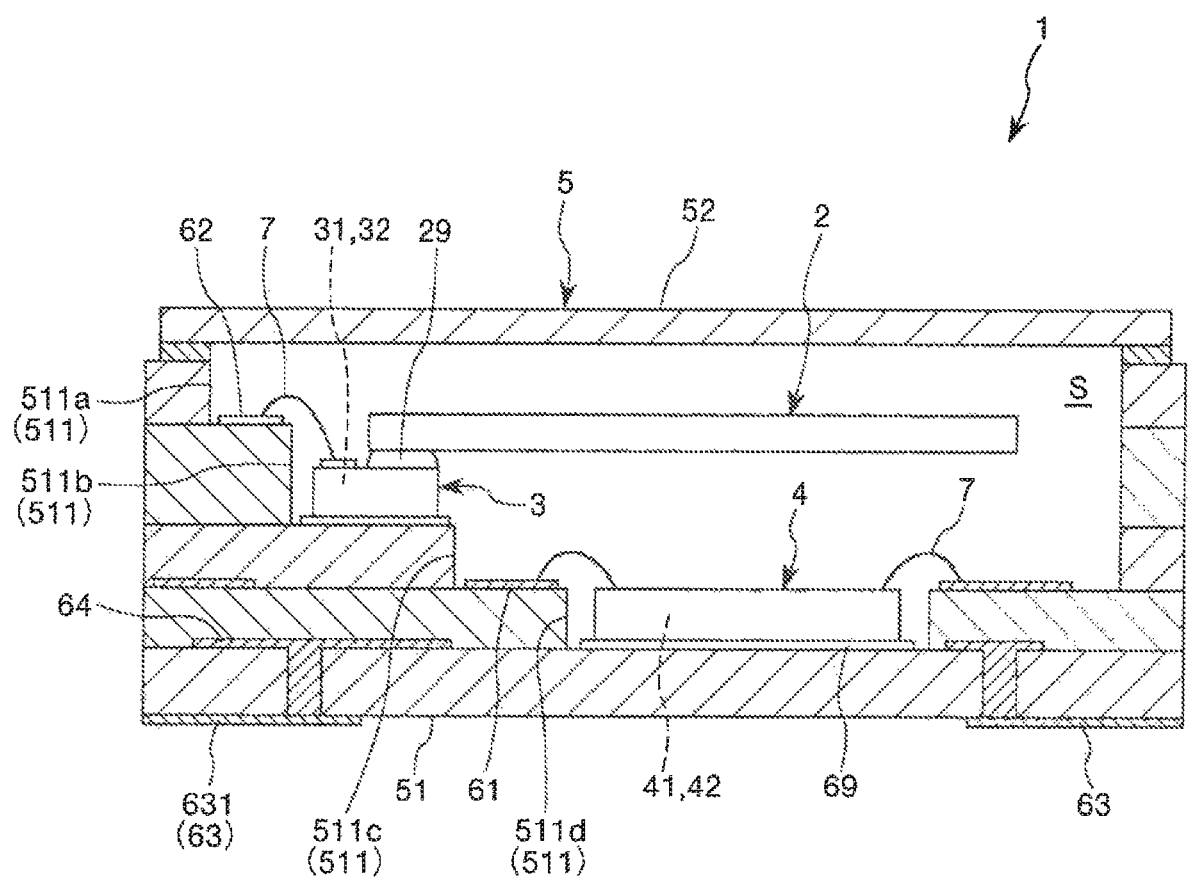
FIG. 2 is a cross-sectional view of a package provided to the oscillator shown in FIG. 1.
Figure 3:
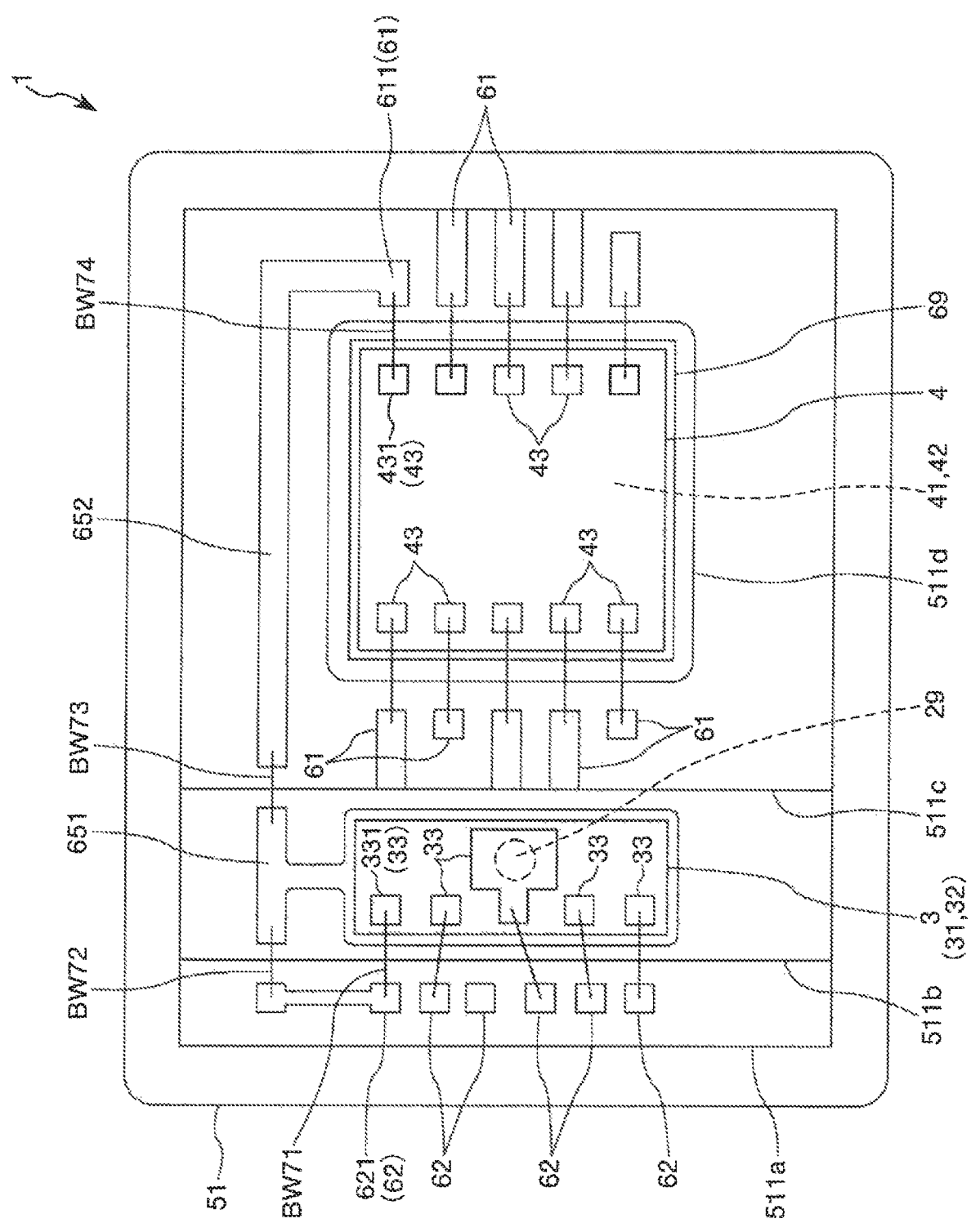
FIG. 3 is a top view of the package shown in FIG. 2.
Figure 4:
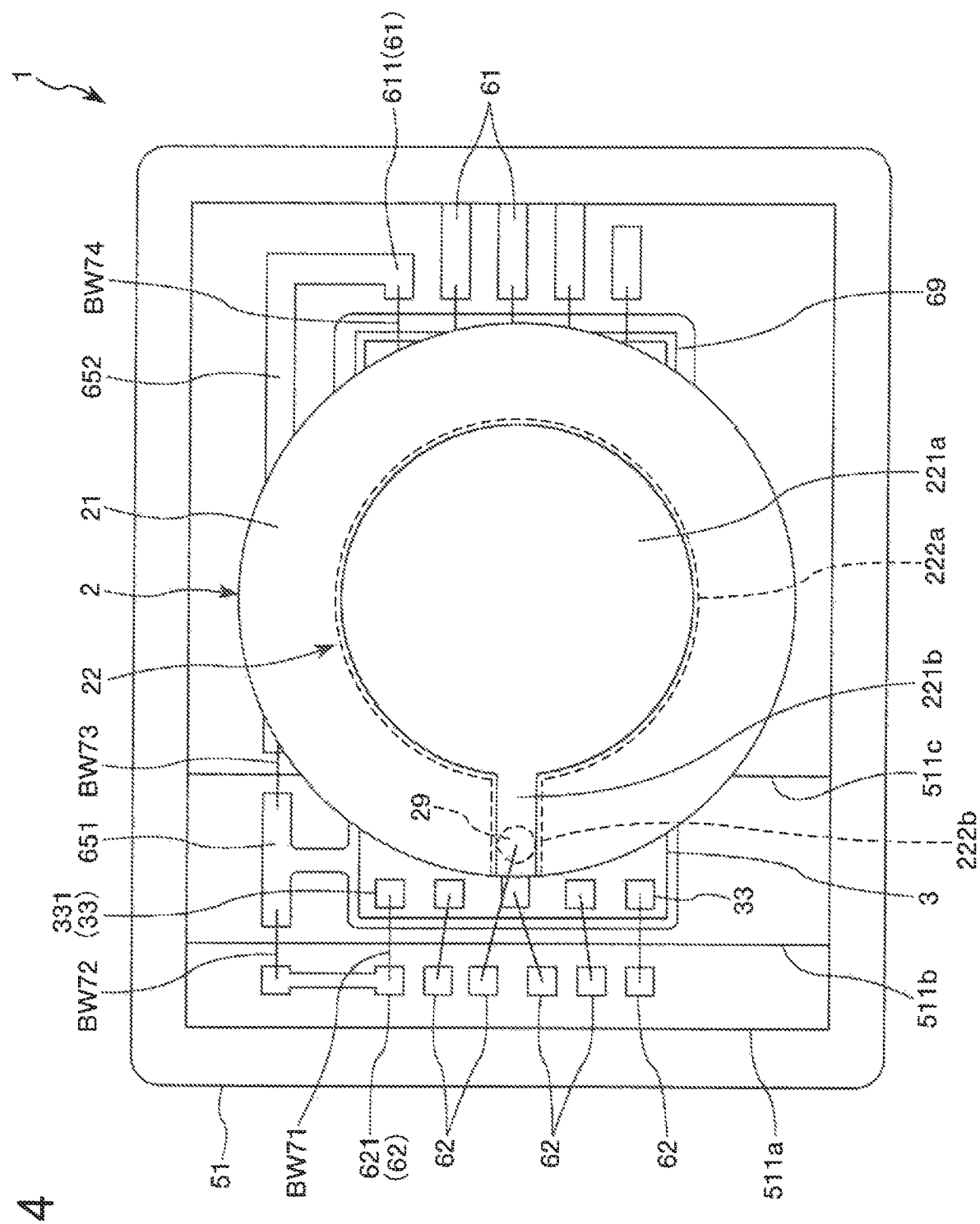
FIG. 4 is a top view of the package shown in FIG. 2.
Figure 5:
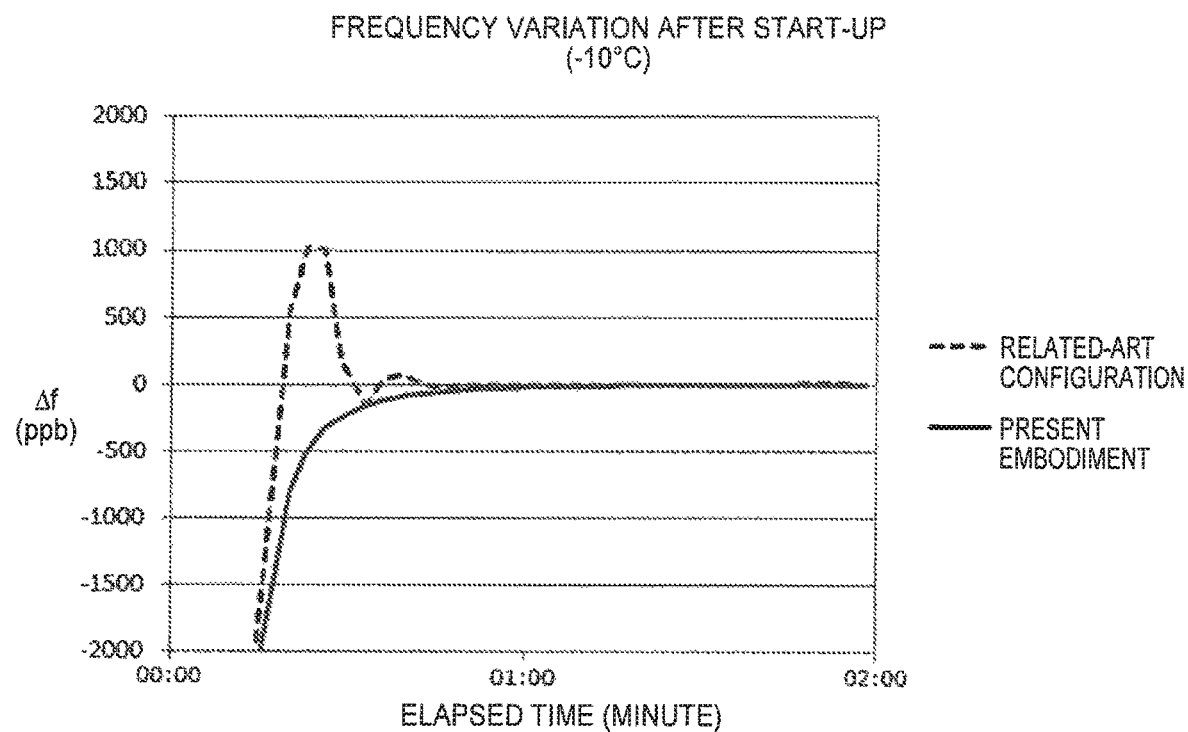
FIG. 5 is a graph showing the frequency characteristic when starting up the oscillator under the environment at −10° C.
Figure 6:
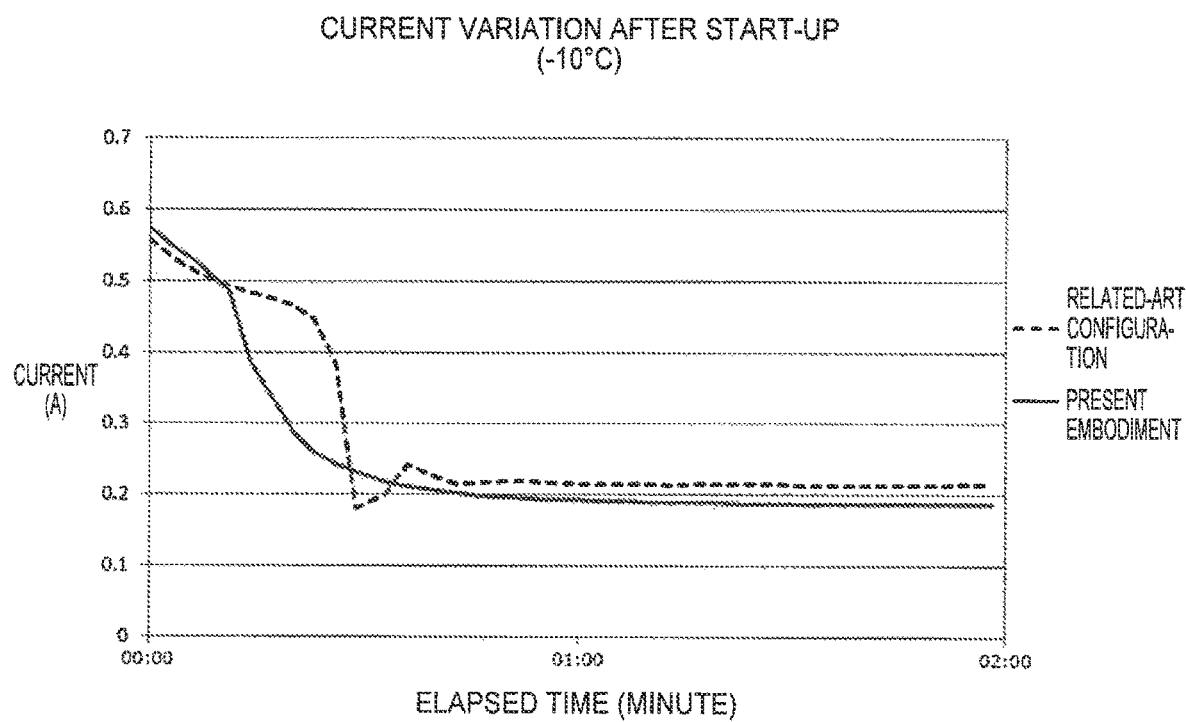
FIG. 6 is a graph showing an amount of a current flowing through a heating element when starting up the oscillator under the environment at −10° C.
Figure 7:
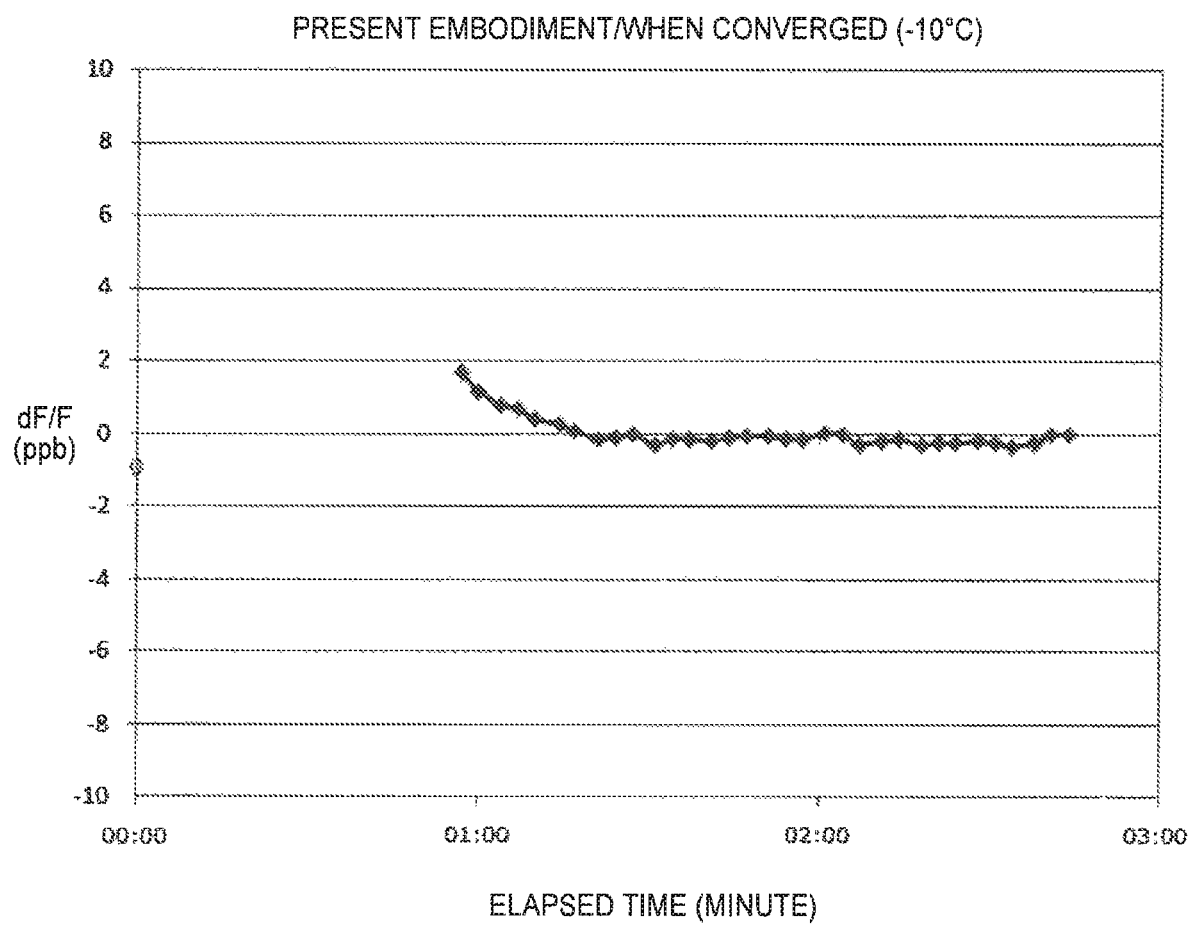
FIG. 7 is a graph showing the frequency characteristic when converged in the case of driving the oscillator according to the embodiment under the environment at −10° C.
Figure 8:
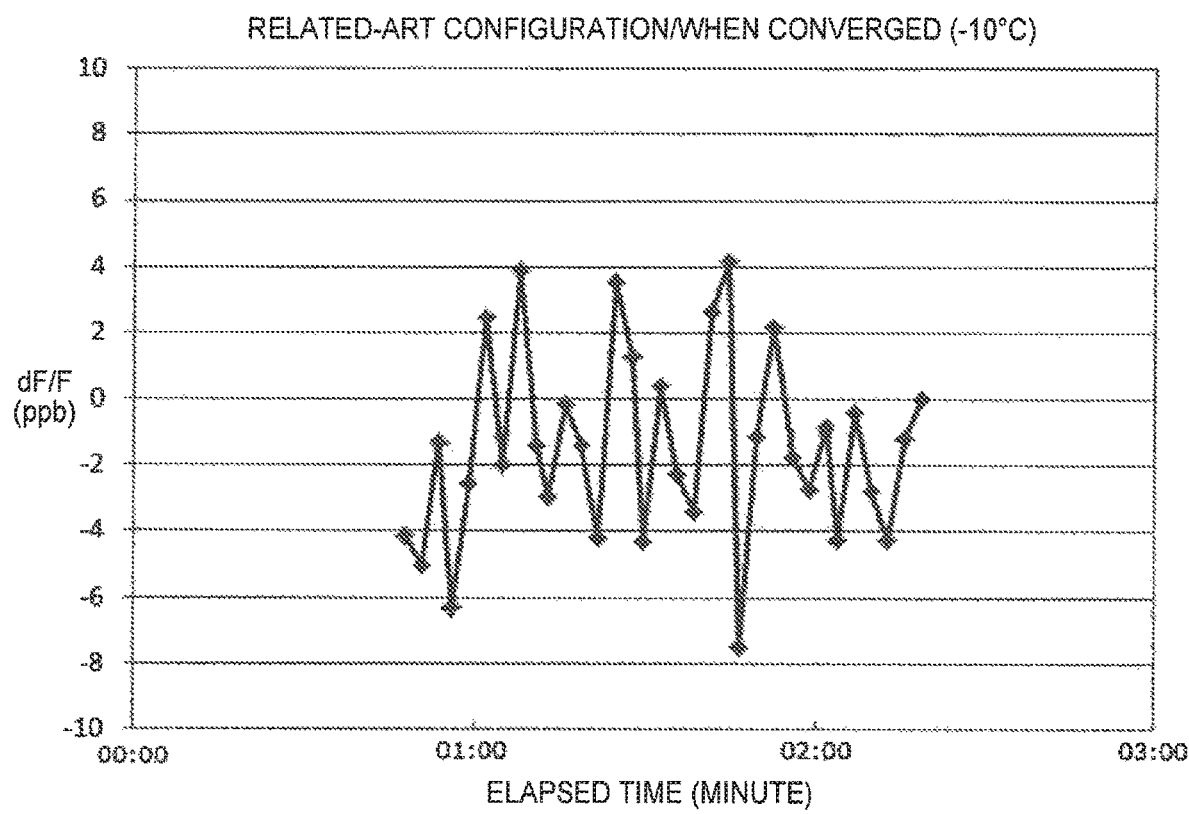
FIG. 8 is a graph showing the frequency characteristic when converged in the case of driving the oscillator having a related-art structure under the environment at −10° C.

FIG. 1 is a cross-sectional view of an oscillator according to a preferred embodiment. FIG. 2 is a cross-sectional view of a package provided to the oscillator shown in FIG. 1. FIG. 3 and FIG. 4 are each a top view of the package shown in FIG. 2. FIG. 5 is a graph showing the frequency characteristic when starting up the oscillator under the environment at −10° C. FIG. 6 is a graph showing an amount of a current flowing through a heating element when starting up the oscillator under the environment at −10° C. FIG. 7 is a graph showing the frequency characteristic when converged in the case of driving the oscillator according to the embodiment under the environment at −10° C. FIG. 8 is a graph showing the frequency characteristic when converged in the case of driving the oscillator having the related-art structure under the environment at −10° C. It should be noted that the upper side of FIG. 1 is also referred to as an "upper side," and the lower side thereof is also referred to as a "lower side" in the following descriptions for the sake of convenience of explanation.

The oscillator 1 is an oven-controlled crystal oscillator (OCXO), and includes a quartz crystal resonator element 2 as an oscillation element, a heating circuit 31 for controlling the temperature of the quartz crystal resonator element 2, a temperature detection circuit 32 for detecting the ambient temperature of the quartz crystal resonator element, a temperature control circuit 42 for controlling an operation of the heating circuit 31 based on the output of the temperature detection circuit 32, a package 5 as a container having a housing space S, and housing the quartz crystal resonator element 2, the heating circuit 31, the temperature detection circuit 32, and the temperature control circuit 42 in the housing space S, a ground external terminal 631 disposed on an outer surface of the package 5 and electrically connected to each of the ground of the temperature detection circuit 32 and the ground of the temperature control circuit 42, and connecting wires 7 electrically connecting the ground of the temperature detection circuit 32 and the ground of the temperature control circuit 42 to each other in the housing space S as shown in FIG. 2. According to such an oscillator 1, it is possible to reduce the deterioration of the accuracy of the temperature control. Hereinafter, the oscillator 1 will be described in detail.

As shown in FIG. 1, the oscillator 1 includes the quartz crystal resonator element 2, a heating element 3 as a first integrated circuit element, a circuit element 4 as a second integrated circuit element, the connecting wires 7, the package 5 for housing the quartz crystal resonator element 2, the heating element 3, the circuit element 4, and the connecting wires 7 in the housing space S, and an outer package 8 covering the package 5.

Package

The package 5 has an insulating property, and includes a base 51 for supporting the quartz crystal resonator element 2, the heating element 3, the circuit element 4 and the connecting wires 7, and a lid 52 as a lid bonded to the base 51 so as to form the housing space S with the base 51.

As shown in FIG. 2, the base 51 has a cavity shape having a recess 511 opening on the upper surface. Further, the recess 511 includes a first recess 511a opening on the upper surface of the base 51, a second recess 511b opening on the bottom surface of the first recess 511a, a third recess 511c opening on the bottom surface of the second recess 511b, and a fourth recess 511d opening on the bottom surface of the third recess 511c. In contrast, the lid 52 is bonded to the upper surface of the base 51 so as to close the opening of the recess 511. As described above, the housing space S is created by the lid 52 closing the opening of the recess 511, and houses the quartz crystal resonator element 2, the heating element 3, the circuit element 4 and the connecting wires 7.

The housing space S is airtightly sealed, and is in a reduced-pressure state (e.g., not higher than 10 Pa, or preferably a vacuum state). Thus, it is possible to continue stable drive of the quartz crystal resonator element 2. It should be noted that the environment in the housing space S is not particularly limited, but can be filled with an inert gas such as nitrogen or argon to be at the atmospheric pressure.

The constituent material of the base 51 is not particularly limited, but a variety of types of ceramics such as aluminum oxide can be used. In this case, by calcining a stacked body of ceramic sheets (green sheets), the base 51 can be manufactured. Further, the constituent material of the lid 52 is not particularly limited, but a member with a linear expansion coefficient similar to that of the constituent material of the base 51 is preferable. For example, if the ceramics described above is used as the constituent material of the base 51 described above, an alloy such as Kovar is preferably used.

Further, as shown in FIG. 2, the base 51 includes a plurality of internal terminals 61 disposed on the bottom surface of the third recess 511c, a plurality of internal terminals 62 disposed on the bottom surface of the first recess 511a, and a plurality of external terminals 63 disposed on the bottom surface of the base 51. The plural internal terminals 61 are electrically connected to the circuit element 4 via respective bonding wires, and the plural internal terminals 62 are electrically connected to the heating element 3 and the quartz crystal resonator element 2 via respective bonding wires. Further, these terminals 61, 62, and 63 are electrically connected to each other via internal interconnections 64 embedded in the base 51 as needed.

Further, the plurality of external terminals 63 disposed on the bottom surface of the base 51 includes the ground external terminal 631, and both of the ground of the heating element 3 and the ground of the circuit element 4 are electrically connected to the ground external terminal 631. As described above, by disposing the plurality of external terminals 63 on the base 51, it becomes easy to electrically connect the external terminals 63 to the internal terminals 61, 62 via the internal interconnections 64.

Heating Element

The heating element 3 is housed in the housing space S, and is fixed to the bottom surface of the second recess 511b via an adhesive or the like. The heating element 3 is an electronic component having a so-called "constant-temperature function" for heating the quartz crystal resonator element 2 to keep the temperature of the quartz crystal resonator element 2 roughly constant. By heating the quartz crystal resonator element 2 with the heating element 3 to keep the temperature of the quartz crystal resonator element 2 roughly constant, it is possible to suppress the fluctuation of the frequency due to the temperature variation in the usage environment, and thus, the oscillator 1 having excellent frequency stability can be obtained. It should be noted that it is preferable for the heating element 3 to control the temperature of the quartz crystal resonator element 2 so as to approach a peak temperature (e.g., roughly 70° C. through 100° C. although different by the specification) representing zero temperature coefficient. Thus, it is possible to exert more excellent frequency stability.

The heating element 3 includes, for example, the heating circuit 31 provided with a power transistor, and the temperature detection circuit 32 formed of a diode or a thermistor, so that the temperature of the heating circuit 31 is controlled based on the output from the temperature detection circuit 32 to be able to keep the quartz crystal resonator element 2 constant in temperature. By including the heating circuit 31 and the temperature detection circuit 32 in the heating element 3 as the same circuit element as described above, the temperature of the heating element 3 can accurately be controlled, the ambient temperature of the quartz crystal resonator element 2 can more accurately be kept constant, and thus, higher frequency stability can be exerted.

It should be noted that the configurations of the heating circuit 31 and the temperature detection circuit 32 are not particularly limited.

As shown in FIG. 3, a plurality of terminals 33 is disposed on the upper surface of the heating element 3, and the plural terminals 33 are electrically connected to the internal terminals 62 via respective bonding wires. Further, the plurality of terminals 33 includes a ground terminal 331, and to the ground terminal 331, there are electrically connected the ground of the heating circuit 31 and the ground of the temperature detection circuit 32. In other words, the temperature detection circuit 32 is electrically connected to the ground common to the heating circuit 31. Further, the ground terminal 331 is electrically connected to the ground external terminal 631 via the internal interconnection 64 in the base 51 from the internal terminal 62 (a ground internal terminal 621 described later).

Quartz Crystal Resonator Element

The quartz crystal resonator element 2 is disposed in the housing space S, and is supported by the heating element 3. As shown in FIG. 4, such a quartz crystal resonator element 2 includes a quartz crystal substrate 21, and electrodes 22 disposed on the quartz crystal substrate 21.

The quartz crystal substrate 21 is obtained by shaping an SC-cut quartz crystal substrate into a roughly circular planar shape by etching, mechanical processing, and so on. By using the SC-cut quartz crystal substrate, it is possible to obtain the quartz crystal resonator element 2, which is small in frequency jump or rise in resistance due to a spurious vibration, and is stable in temperature characteristic.

It should be noted that the planar shape of the quartz crystal substrate 21 is not limited to a circular shape, but can also be a nonlinear shape such as an elliptical shape or an oval shape, or can also be a linear shape such as a triangular shape or rectangular shape. It should be noted that by shaping the quartz crystal substrate 21 into a circular shape as in the present embodiment, symmetry of the quartz crystal substrate 21 is improved, and it is possible to effectively suppress the oscillation in sub-vibration (spurious vibration) mode.

The electrodes 22 include a first excitation electrode 221a and a first extraction electrode 221b disposed on the upper surface (one principal surface) of the quartz crystal substrate 21, and a second excitation electrode 222a and a second extraction electrode 222b disposed on the lower surface (the other principal surface) of the quartz crystal substrate 21.

The quartz crystal resonator element 2 having such a configuration is fixed to the upper surface of the heating element 3 in an outer edge part via a fixation member 29 having electrical conductivity. The fixation member 29 bonds the heating element 3 and the quartz crystal resonator element 2 to each other, electrically connects terminal 33 arranged on the upper surface of the heating element 3 and the second extraction electrode 222b of the quartz crystal resonator element 2 to each other, and further thermally connects the heating element 3 and the quartz crystal resonator element 2 to each other. On the other hand, the first extraction electrode 221b is electrically connected to the internal terminal 62 via a bonding wire.

It should be noted that the fixation member 29 is not particularly limited providing both of the electrical conductivity and a bonding property are provided, and there can be used, for example, a metal bonding material (e.g., a gold bump), an alloy bonding material (e.g., a bump made of a gold-tin alloy or solder), and an electrically-conductive adhesive (e.g., a polyimide series adhesive having metal particles such as silver filler dispersed).

Circuit Element

As shown in FIG. 2, the circuit element 4 is fixed to the bottom surface of the fourth recess 511d via the adhesive or the like. Further, the circuit element 4 is electrically connected to the internal terminals 61 via bonding wires. Such a circuit element 4 includes at least an oscillation circuit 41 for oscillating the quartz crystal resonator element 2, and the temperature control circuit 42 for controlling an operation of the heating circuit 31 based on the output of the temperature detection circuit 32.

As shown in FIG. 3, a plurality of terminals 43 is disposed on the upper surface of the circuit element 4, and the terminals 43 are electrically connected to the corresponding internal terminals 61 via respective bonding wires. Further, the plurality of terminals 43 includes a ground terminal 431 connected to the ground of the circuit element 4 (the temperature control circuit 42). Further, the ground terminal 431 is electrically connected to the ground external terminal 631 via the internal interconnection 64 from the internal terminal 61 (a ground internal terminal 611). In other words, the ground terminal 431 is electrically connected to the ground external terminal 631 common to the ground terminal 331 of the heating element 3.

Further, between the bottom surface of the fourth recess 511d and the circuit element 4, there is disposed an interconnection 69 (a second ground pattern), which is disposed so as to overlap the circuit element 4 in a planar view, and is electrically connected to the ground terminal 431 of the circuit element 4. Thus, for example, it is possible to reduce the capacitive coupling between the internal interconnections 64 and the quartz crystal resonator element 2, and it is possible to more stably drive the quartz crystal resonator element 2.

Connecting Wires

The connecting wires 7 are disposed in the housing space S, and electrically connect the ground of the heating element 3 and the ground of the circuit element 4 to each other. Specifically, as shown in FIG. 3, the ground terminal 331 disposed on the upper surface of the heating element 3 is electrically connected to the ground internal terminal 621 included in the plurality of internal terminals 62 via a bonding wire BW71 as the connecting wire 7. The ground internal terminal 621 is electrically connected to an interconnection 651 disposed on the bottom surface of the second recess 511b via a bonding wire BW72 as the connecting wire 7. The interconnection 651 is disposed on the bottom surface of the third recess 511c, and is electrically connected to an interconnection 652, which is electrically connected to the ground internal terminal 611, via a bonding wire BW73 as the connecting wire 7. Further, the ground internal terminal 611 (the interconnection 652) is electrically connected to the ground terminal 431 disposed on the upper surface of the circuit element 4 via a bonding wire BW74 as the connecting wire 7. In such a manner, the ground of the temperature detection circuit 32 and the ground of the temperature control circuit 42 are electrically connected to each other with the bonding wires BW71, BW72, BW73, and BW74 as the connecting wires 7. By disposing such connecting wires 7, the ground of the temperature detection circuit 32 and the ground of the temperature control circuit 42 are shorted each other (conducted or reduced in potential difference), and the following advantages can be obtained.

Firstly, problems in the configuration in which the connecting wires 7 are eliminated as in the related art will be described. As described above, the ground terminal 331 of the heating element 3 (the temperature detection circuit 32) and the ground terminal 431 of the circuit element 4 (the temperature control circuit 42) are electrically connected to the ground external terminal 631 via the respective interconnections 64. Here, the internal interconnections 64 are each formed of generally a high-melting point metal material such as tungsten or molybdenum, and it is unachievable to provide gold plating on the surfaces of the internal interconnections 64 taking the manufacturing method of the base 51 into consideration, and therefore have a relatively high electric resistance. Further, when the ambient temperature is lower, a relatively high current (e.g., up to about 200 mA) flows through the heating circuit 31, accordingly. Therefore, due to the voltage drop caused by the parasitic resistance of the internal interconnections 64, the ground potential of the heating element 3 varies between the case in which the ambient temperature of the quartz crystal resonator element 2 is low (the case in which a high current flows) and the case in which the ambient temperature thereof is high (the case in which only a low current flows). Specifically, in the case in which, for example, the current flowing through the heating circuit 31 is 200 mA, and the parasitic resistance of the internal interconnections 64 is 0.5Ω, the ground potential of the heating element 3 varies as much as 100 mA. In contrast, such a high current as flowing through the heating element 3 does not flow through the circuit element 4, and the ground potential of the circuit element 4 hardly varies. Therefore, a difference occurs between the temperature-temperature detection circuit output characteristic set in advance to the circuit element 4 and the actual output from the temperature detection circuit 32. In other words, in the case in which, for example, the variation in the ground potential of the heating element 3 due to the parasitic resistance of the internal interconnections 64 is 100 mV, the output value of the temperature detection circuit 32 rises as much as 100 mV, and is input to the temperature control circuit 42. Therefore, it results that the temperature control circuit 42 controls drive of the heating circuit 31 based on the temperature shifted from the actual temperature, and thus, the accuracy of the temperature control by the temperature control circuit 42 deteriorates.

In contrast, in the oscillator 1 according to the present embodiment, the ground terminal 331 of the heating element 3 and the ground terminal 431 of the circuit element 4 are electrically connected using the connecting wires 7 without passing through the internal interconnections 64. In other words, the electric path electrically connecting the ground terminal 331 (the ground of the temperature detection circuit 32) and the ground terminal 431 (the ground of the temperature control circuit 42) of the circuit element 4 to each other via the connecting wires 7 does not pass through the internal interconnections 64 embedded inside the base 51 (the package 5).

The bonding wires BW71, BW72, BW73, and BW74 as the connecting wires 7 are each formed of, for example, Au (gold), Cu (copper), or Al (aluminum) as a chief material, and are each sufficiently reduced in electric resistance. Further, since the ground internal terminal 621, the interconnections 651, 652, to which the bonding wire BW71 through BW74 are connected, are each exposed to the housing space S, it is possible to provide gold plating on the surface thereof taking the manufacturing process of the base 51 into consideration, and in reality, the gold plating is provided on the surface thereof. Therefore, the ground internal terminal 621 and the interconnections 651, 652 are each sufficiently reduced in electric resistance. Therefore, the electric resistance of the path connecting the ground terminal 331 and the ground terminal 431 to each other via the connecting wires 7 is suppressed to a level sufficiently lower than the electric resistance of the path connecting the ground terminal 331 and the ground terminal 431 to each other via the internal interconnections 64. Therefore, according to the oscillator 1 having such a configuration, it is possible to reduce the fluctuation of the ground potential of the heating element 3 due to the parasitic resistance of the internal interconnections 64 described above, and thus, it is possible to particularly improve the accuracy of the drive control of the heating circuit 31 by the temperature control circuit 42.

The effectiveness described above will be proved based on experimental data of the frequency characteristic immediately after the start-up, a current variation immediately after the start-up, and the frequency characteristic when converged. FIG. 5 is a graph showing the frequency characteristic when starting up the oscillator under the environment at −10° C. hit with winds of 3 m/s. It should be noted that Δf (ppb) in FIG. 5 represents a value obtained by converting a difference between the target oscillation frequency and the actual oscillation frequency into ppb based on the target oscillation frequency. As is obvious from the drawing, compared to the related-art oscillator (i.e., the oscillator not provided with the connecting wires 7, and in which the ground terminal 331 and the ground terminal 431 are connected only via the internal interconnections 64), in the oscillator 1 according to the present embodiment, the time until the frequency converges is roughly the same, but the frequency variation (fluctuation) until the frequency converges is suppressed to a low level, and the frequency converges smoothly.

FIG. 6 is a graph showing the current flowing through the heating element 3 when starting up the oscillator under the environment at −10° C. hit with winds of 3 m/s. As is obvious from the drawing, compared to the related-art oscillator, in the oscillator 1 according to the present embodiment, the time until the current value converges is roughly the same, but the current value variation (fluctuation) until the current value converges is suppressed to a low level, and the current value converges smoothly.

FIG. 7 and FIG. 8 are each a graph showing how the frequency is converging in the case of driving the oscillator under the environment at −10° C. hit with winds of 3 m/s, wherein FIG. 7 shows the present embodiment, and FIG. 8 shows a related-art configuration. It should be noted that the reference symbol F denotes the target oscillation frequency, and the reference symbol dF denotes the difference between the target frequency and the actual oscillation frequency. As is obvious from the comparison between FIG. 7 and FIG. 8, in the oscillator 1 according to the present embodiment the fluctuation (amplitude) of the frequency when converged becomes dramatically small compared to the related-art oscillator.

From the graphs described above, it can be understood that according to the oscillator 1, since it is possible to smoothly converge the frequency and the current value to suppress the fluctuation of the frequency after converged to a low level, the accuracy of the drive control of the heating circuit 31 by the temperature control circuit 42 can be improved.

In particular, such an oscillator 1 can effectively exert the effect in the case in which the maximum value of the current flowing through the heating circuit 31 within the standard temperature range is equal to or higher than 100 mA, more effectively exert the effect in the case in which the maximum value is equal to or higher than 150 mA, and further more effectively exert the effect in the case in which the maximum value is equal to or higher than 200 mA. It should be noted that the "standard temperature range" denotes the range in which the oscillation characteristic equal to or better than a predetermined level can be maintained (in other words, the temperature range in which the manufacturer or the supplier of the oscillator 1 guarantees the frequency accuracy, or recommends to use the oscillator 1, for example, the warranty range of the accuracy of the oscillation frequency described in the specification of the oscillator 1, or the temperature range of the maximum rating or the absolute maximum rating, in which the oscillator 1 can repeatedly perform the normal operation). It should be noted that it is generally required to guarantee predetermined frequency accuracy within the usage temperature range of not lower than −40° C. and not higher than 85° C.

The connecting wires 7 are hereinabove described. By using the bonding wires BW71, BW72, BW73, and BW74 as the connecting wires 7 as in the present embodiment, it is possible to directly connect the terminals (interconnections), which are to be connected, to each other with a shorter distance, the electric resistance can be reduced to a lower level. Further, the configuration of the connecting wires 7 becomes simple, and it is possible to efficiently achieve an overall layout configuration of the connecting wires 7 without waste. Further, the degree of freedom of the layout of the interconnections 651, 652 increases, and it is possible to electrically connect the grand terminal 331 of the heating element 3 and the grand terminal 431 of the circuit element 4 to each other with ease.

In particular, since in the present embodiment, a plurality of bonding wires as the connecting wires 7 is disposed (disposed so as to be separated into a plurality of conductive wires), namely the ground terminal 331 and the ground internal terminal 621 are connected to each other by the bonding wire BW71, the ground internal terminal 621 and the interconnection 651 are connected to each other by the bonding wire BW72, the interconnection 651 and the interconnection 652 are connected to each other by the bonding wire BW73, and the interconnection 652 and the ground terminal 431 are connected to each other by the bonding wire BW74, the overall layout configuration of the connecting wires 7 can more efficiently be achieved, and the ground terminal 331 of the heating element 3 and the ground terminal 432 of the circuit element 4 can electrically be connected to each other with greater ease. In particular, since the ground terminal 331, the ground internal terminal 621, the interconnection 651, the interconnection 652, and the ground terminal 431 are arranged with a step disposed in between, by disposing the plurality of bonding wires each capable of connecting the terminals (interconnections) to each other straddling the step, the terminals (interconnections) can easily be connected to each other.

Further, in the present embodiment, there are provided the interconnections (i.e., the ground internal terminal 621 for electrically connecting the bonding wires BW71, BW72 to each other, the interconnection 651 for electrically connecting the bonding wires BW72, BW73 to each other, and the interconnection 652 for electrically connecting the bonding wires BW73, BW74 to each other) for electrically connecting a plurality of connecting wires 7 to each other, and arranged in the package 5 so as to be exposed to the housing space S. As described above, since the ground internal terminal 621 and the interconnections 651, 652 are disposed so as to be exposed to the housing space S (at least a part of each of the ground internal terminal 621 and the interconnections 651, 652 is exposed to the housing space S), gold plating is provided to the surface of each of the ground internal terminal 621 and the interconnections 651, 652. In other words, the ground internal terminal 621 and the interconnections 651, 652 each include a gold-plated layer to reduce the electric resistance. Therefore, it is possible to more effectively exert the effect (improvement in accuracy of the drive control of the heating circuit 31 by the temperature control circuit 42) described above. Further, by using such interconnections, it is possible to more easily connect the ground terminal 331 of the heating element 3 and the ground terminal 431 of the circuit element 4 to each other.

Further, the interconnection 651 (the first ground pattern) is also disposed between the bottom surface of the second recess 511b and the heating element 3 so as to overlap the heating element 3 in a planar view. Therefore, for example, it is possible to reduce the capacitive coupling between the internal interconnections 64 and the quartz crystal resonator element 2, and it is possible to more stably drive the quartz crystal resonator element 2.

External Package

As shown in FIG. 1, the external package 8 has a base substrate 81 formed of a printed circuit board, and a cap 82 bonded to the base substrate 81, and the package 5, and circuit components 9 such as a capacitor or a resistor are housed in an internal space S1 formed by the base substrate 81 and the cap 82. The package 5 is bonded to the base substrate 81 via a lead frame 83, and is supported in a state of being separated from the base substrate 81. It should be noted that the lead frame 83 fixes the package 5 to the base substrate 81, and at the same time, electrically connects the external terminals 63 of the package 5 and terminals not shown provided to the base substrate 81 to each other.

The internal space S1 is airtightly sealed, and is in a reduced-pressure state (e.g., not higher than 10 Pa, or preferably a vacuum state). Thus, the internal space S1 functions as a heat-insulating layer, and the quartz crystal resonator element 2 becomes harder to be affected by the change in the temperature of the usage environment. Therefore, the temperature of the quartz crystal resonator element 2 can more accurately be kept constant. It should be noted that the environment of the internal space S1 is not limited to the above, but can be filled with an inert gas such as nitrogen, argon, or helium, or can also be open to the atmosphere.

The oscillator 1 is hereinabove described. Although in the present embodiment, the heating circuit 31 and the temperature detection circuit 32 are included in the heating element 3 as the same circuit element, the heating circuit 31 and the temperature detection circuit 32 can be separated from each other. For example, it is sufficient to configure the temperature detection circuit 32 as a separate body from the heating element 3, and dispose the temperature detection circuit 32 adjacent to the heating element 3. In this case, the temperature detection circuit 32 can be provided with a configuration including a thermistor, a thermopile and so on. Further, although in the present embodiment, the connecting wires 7 are each formed of the bonding wire, the configuration of the connecting wires 7 is not particularly limited, but the connecting wires 7 can also be formed of, for example, interconnections or metal bumps. Further, the number of the connecting wires 7 can also be set properly, and can be not larger than two, or not smaller than four. Further, in the present embodiment, although there are included the interconnections (the ground internal terminal 621 and the interconnections 651, 652) for connecting the bonding wires to each other, these interconnections can be omitted. In this case it is sufficient to electrically connect the ground terminal 331 and the ground terminal 431 directly to each other with, for example, the bonding wire BW71.

Further, although in the present embodiment, there is described the configuration of using the quartz crystal resonator element 2 as the oscillation element, the oscillation element is not limited to the quartz crystal resonator element 2, but there can be used a piezoelectric resonator element using a substrate made of an oxide such as aluminum nitride (AlN), lithium niobate (LiNbO$_3$), lithium tantalate (LiTaO$_3$), lead zirconium titanate (PZT), lithium tetraborate (Li$_2$B$_4$O$_7$), langasite (La$_3$Ga$_5$SiO$_{14}$), potassium niobate (KNbO$_3$), gallium phosphate (GaPO$_4$), gallium arsenide (GaAs), zinc oxide (ZnO, Zn$_2$O$_3$), barium titanate (BaTiO$_3$), lead titanate (PbPO$_3$), sodium potassium niobate ((K, Na)NbO$_3$), bismuth ferrite (BiFeO$_3$), sodium niobate (NaNbO$_3$), bismuth titanate (Bi$_4$Ti$_3$O$_{12}$), bismuth sodium titanate (Na$_{0.5}$Bi$_{0.5}$TiO$_3$), a layered piezoelectric substrate configured by stacking the piezoelectric material such as aluminum nitride or tantalum pentoxide (Ta$_2$O$_5$) on a glass substrate, or a piezoelectric ceramics. Further, it is also possible to use a resonator element having piezoelectric element disposed on a silicon substrate. Further, the quartz crystal resonator element 2 is not limited to the SC-cut quartz crystal resonator element, but it is also possible to use, for example, an At-cut, a BT-cut, a Z-cut, or an LT-cut quartz crystal resonator element.

Electronic Apparatus

Then, an electronic apparatus equipped with the oscillator according to an embodiment will be described.

Figure 9:
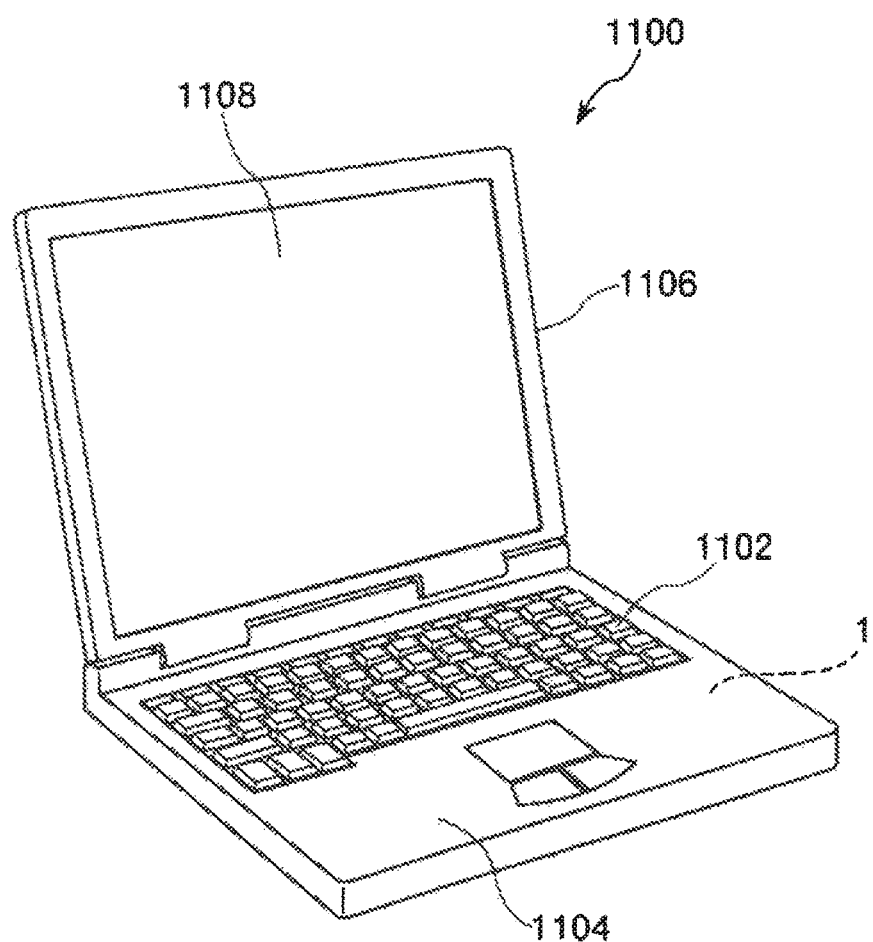
FIG. 9 is a perspective view showing a configuration of a mobile-type (or notebook-type) personal computer.

FIG. 9 is a perspective view showing a configuration of a mobile type (or laptop type) personal computer as the electronic apparatus according to the embodiment.

In the drawing, the personal computer 1100 includes a main body section 1104 provided with a keyboard 1102, and a display unit 1106 provided with a display section 1108, and the display unit 1106 is pivotally supported with respect to the main body section 1104 via a hinge structure. Such a personal computer 1100 incorporates the oscillator 1.

Figure 10:
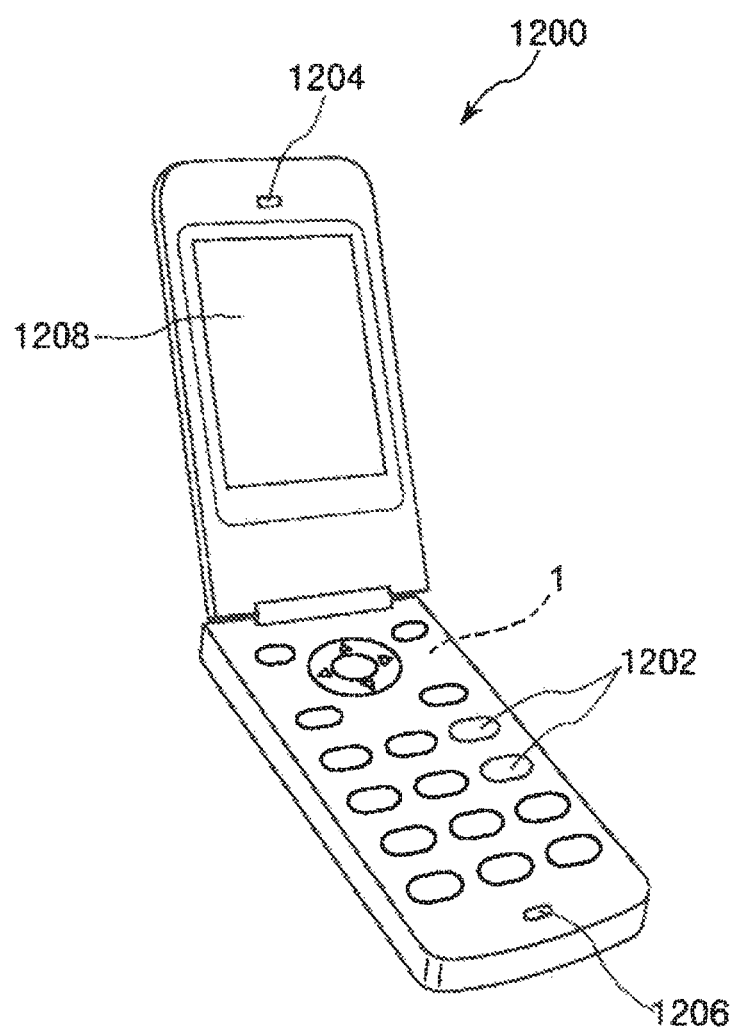
FIG. 10 is a perspective view showing a configuration of a cellular phone (including PHS).

FIG. 10 is a perspective view showing a configuration of a cellular phone (including PHS) as an embodiment of the electronic instrument.

In this drawing, the cellular phone 1200 is provided with an antenna (not shown), a plurality of operation buttons 1202, an ear piece 1204, and a mouthpiece 1206, and a display section 1208 is disposed between the operation buttons 1202 and the earpiece 1204. Such a cellular phone 1200 incorporates the oscillator 1.

Figure 11:
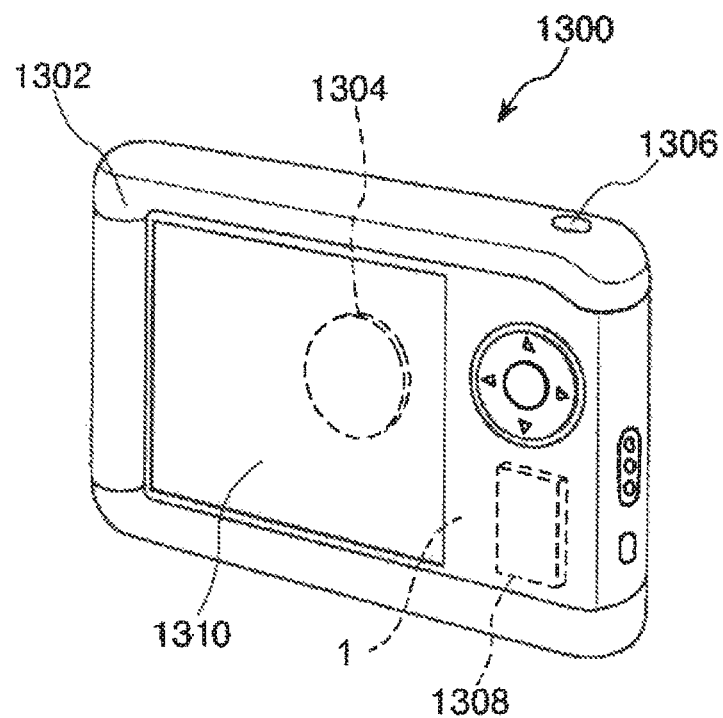
FIG. 11 is a perspective view showing a configuration of a digital still camera.

FIG. 11 is a perspective view showing a configuration of a digital still camera applying the electronic apparatus.

The case (body) 1302 of the digital still camera 1300 is provided with a display section 1310 disposed on the back surface thereof to have a configuration of performing display in accordance with the imaging signal from the CCD, wherein the display section 1310 functions as a viewfinder for displaying the object as an electronic image. Further, the front surface (the back side in the drawing) of the case 1302 is provided with a light receiving unit 1304 including an optical lens (an imaging optical system), the CCD, and so on. Then, when the photographer checks an object image displayed on the display section 1310, and then presses a shutter button 1306, the imaging signal from the CCD at that moment is transferred to and stored in a memory device 1308. Such a digital still camera 1300 incorporates the oscillator 1.

Since such an electronic apparatus includes the oscillator 1, the electronic apparatus can obtain the advantage of the oscillator described above, and can exert the excellent reliability.

It should be noted that, as the electronic apparatus according to the embodiment, there can be cited, for example, a smartphone, a tablet terminal, a timepiece (including a smart watch), an inkjet ejection device (e.g., an inkjet printer), a laptop personal computer, a television set, a wearable terminal such as a head-mounted display (HMD), a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, a variety of types of measurement instruments, abase station apparatus for a mobile terminal, a variety of types of gauges (e.g., gauges for a vehicle, an aircraft, or a ship), a flight simulator, and a net-work server besides the personal computer shown in FIG. 9, the cellular phone shown in FIG. 10, and the digital still camera shown in FIG. 11.

Vehicle

Then, a vehicle equipped with the oscillator according to an embodiment will be described.

Figure 12:
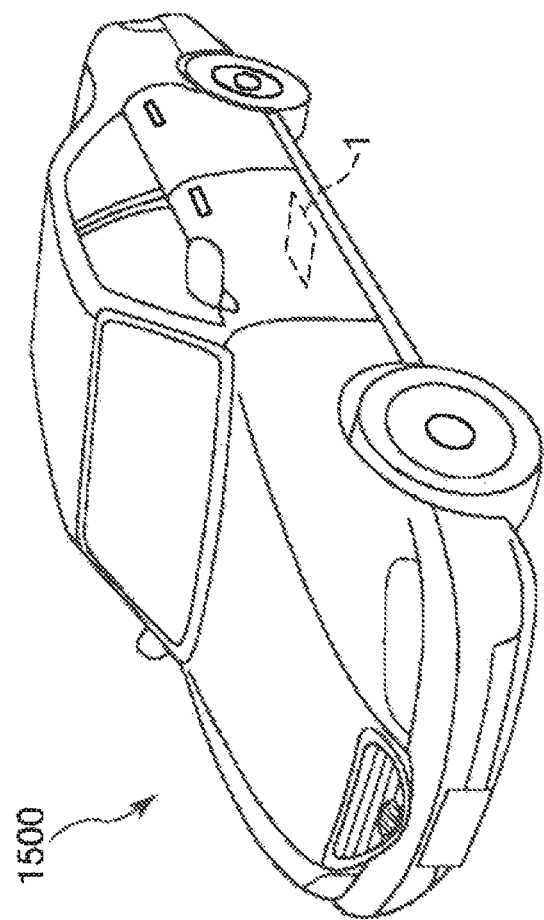
FIG. 12 is a perspective view showing a car.

FIG. 12 is a perspective view showing a car as an application of the vehicle according to the embodiment.

As shown in FIG. 12, the car 1500 incorporates the oscillator 1. The oscillator 1 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

Since such a car 1500 includes the oscillator 1, the car can obtain the advantage of the oscillator 1 described above, and can exert the excellent reliability.

Although the oscillator, the electronic apparatus, and the vehicle according to the invention are described based on the embodiments shown in the accompanying drawings, the invention is not limited to these embodiments, but the configuration of each of the sections can be replaced with those having an identical function and an arbitrary configuration. Further, it is also possible to add any other constituents to the invention.

What is claimed is:

1. An oscillator comprising:
a container having a base, a lid and a space within and defined by the base and the lid;
an oscillation element housed in the container;
a heating circuit housed in the container, and adapted to control a temperature of the oscillation element;
a temperature detection circuit housed in the container;
a temperature control circuit housed in the container, and adapted to control the heating circuit based on an output of the temperature detection circuit;
at least one connecting wire housed in the container, and electrically connects a ground of the temperature detection circuit and a ground of the temperature control circuit to each other;
a ground external terminal disposed on an outer surface of the container, and electrically connected to the ground of the temperature detection circuit and the ground of the temperature control circuit; and
an internal interconnection embedded in the base of the container,
wherein,
the ground external terminal and the grounds of the temperature detection circuit and the temperature control circuit are electrically connected via the internal interconnection, and
the ground of the temperature detection circuit and the ground of the temperature control circuit are electrically connected not via the internal interconnection.

2. The oscillator according to claim 1, further comprising:
a heating element that includes the heating circuit and the temperature detection circuit.

3. The oscillator according to claim 1, wherein
the at least one connecting wire is a bonding wire disposed in the space of the container.

4. The oscillator according to claim 1, wherein
the number of the at least one connecting wire is plural.

5. The oscillator according to claim 4, further comprising:
an interconnection provided to the container, at least partially exposed to the space of the container, and electrically connecting the plurality of connecting wires to each other.

6. The oscillator according to claim 1, wherein
the base of the container has an insulating property, and supports the oscillation element, the heating circuit, the temperature detection circuit, and the temperature control circuit, and
the ground external terminal is disposed on the base.

7. The oscillator according to claim 1, further comprising:
a first integrated circuit element including the heating circuit and the temperature detection circuit; and
a second integrated circuit element including the temperature control circuit.

8. An electronic apparatus comprising:
the oscillator according to claim 1.

9. A vehicle comprising:
the oscillator according to claim 1.

10. The oscillator according to claim 7, further comprising:
a first ground pattern electrically connected to a ground terminal of the first integrated circuit element, and overlapping the first integrated circuit element in a planar view; and
a second ground pattern electrically connected to a ground terminal of the second integrated circuit element, and overlapping the second integrated circuit element in a planar view,
wherein the first ground pattern and the second ground pattern are electrically connected to each other by the at least one connecting wire.

* * * * *